(12) United States Patent
Fukunaga (10) Patent No.: US 6,334,523 B1
(45) Date of Patent: Jan. 1, 2002

(54) COMPONENT CONVEYOR

(75) Inventor: Shigeki Fukunaga, Yokaichi (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/567,016

(22) Filed: May 9, 2000

(30) Foreign Application Priority Data

May 12, 1999 (JP) .......................................... 11-131892

(51) Int. Cl.$^7$ .............................................. B65G 47/00
(52) U.S. Cl. ................................ 198/345.3; 198/465.2; 198/619
(58) Field of Search ........................ 198/345.3, 465.2, 198/619

(56) References Cited

U.S. PATENT DOCUMENTS

| | | | | |
|---|---|---|---|---|
| 1,926,914 A | * | 9/1933 | Popov ..................... | 198/465.2 |
| 2,789,683 A | * | 4/1957 | Stahl ...................... | 198/465.2 |
| 3,595,368 A | * | 7/1971 | Mantovani ............... | 198/465.2 |
| 4,570,782 A | * | 2/1986 | Cargill et al. ............ | 198/345.3 |
| 4,704,792 A | * | 11/1987 | Itagaki et al. ............ | 198/619 |
| 6,045,319 A | * | 4/2000 | Uchida et al. ............ | 198/619 |

FOREIGN PATENT DOCUMENTS

| | | | |
|---|---|---|---|
| GB | 895181 | * 5/1962 | ............. 198/465.2 |
| JP | 5-63398 | 3/1993 | |
| JP | 9-186193 | 7/1997 | |

* cited by examiner

*Primary Examiner*—Joseph E. Valenza
(74) *Attorney, Agent, or Firm*—Burns, Doane, Swecker & Mathis, LLP (57) ABSTRACT

A component conveyor which can spend sufficient time for picking and placing operation has low energy consumption, and the moving speed of the head is fast. In order to pick and place a component P, there are provided several movable heads 6 to 9, movable along a closed path, magnets 15$a$2 to 15$d$2 and coils 14$a$ to 14$d$, both of which stop the head at the picking position and the placing position, and magnets 16$a$ to 16$d$ which transfer the kinetic energy of the moving head to the stopped head at the picking position or the placement position. By applying the initial velocity in the progress direction to at least one head, the kinetic energy is sequentially transmitted to the following head. A moving head is made to stop at a position of the preceding head. Thus, the kinetic energy of the moving head is transmitted to the stopped head. By using the repulsion effect, moving and stopping of the head is efficiently performed.

8 Claims, 6 Drawing Sheets

COMPONENT CONVEYOR

The present application is related and claims priority under 35 U.S.C. § 119 to Japanese Patent Application No. 11-131892, filed May 12, 1999, the entire contents of which are incorporated herein by reference.

BACKGROUND OF THE INVENTION

1. Field of the Invention

This invention relates to an apparatus which conveys a component in order to pick and place the component.

2. Brief Description of the Related Art

Conventionally, in a mounting process or the like of a component, a conveying apparatus is used in which the component is held from a component supply apparatus (also called a picking operation) and the component is put on a circuit board or the like (also called a placing operation). For example, the conveying of the component is performed in such a way that the head which absorbs a component moves reciprocally to the picking position and the placing position by a motor, as in unexamined-Japanese-patent-No. 5-63398 gazette. The conveying of the component is performed in such a way that a plurality of absorbing heads are provided to rotation boards, such as an index unit, and the rotation boards are rotated, as in the unexamined-Japanese-patent-No. 9-186193 gazette.

However, in this kind of conveyor, much energy is consumed at the time of driving, and the number of parts of the apparatus becomes great, and therefore they are large-sized. The control system is complicated, it becomes expensive, and the moving speed of the head is slow. The traveling time of the head is also long. There are those above described problems, and especially after holding a component at the picking position while it is conveyed to the placing position, the head is made to move and stop. However, movement is slow because of inertial mass, and peak velocity cannot be increased. Moreover, during a series of processes, because the traveling time is the greatest, sufficient time for the picking operation and the placing operation cannot be spent. Therefore, it has been difficult to perform reliable picking and a placing operations.

Consequently, the objective of this invention eliminates the above problems. There is provided a component conveyor driven based on a completely new principle.

SUMMARY OF THE INVENTION

According to a first exemplary embodiment, a component conveyor comprises a plurality of heads movable along a closed path for picking and placing operations of a component, means for stopping the plurality of heads at a picking position and a placing position, and means for transmitting the kinetic energy of a moving one of the plurality of heads to a stopped one of the plurality of heads at the picking position or the placing position, and for causing them to be mutually repelled, wherein, by applying an initial velocity in a progress direction along said closed path to at least one of the plurality of heads, the kinetic energy of said at least one head is transmitted to another one of the plurality of heads, and the at least one head is thereby made to stop at the position of the stopped head.

Still other objects, features, and attendant advantages of the present invention will become apparent to those skilled in the art from a reading of the following detailed description of embodiments constricted in accordance therewith, taken in conjunction with the accompanying drawings.

BRIEF DESCRIPTION OF THE DRAWINGS

The invention of the present application will now be described in more detail with reference to preferred embodiments of the apparatus and method, given only by way of example, and with reference to the accompanying drawings, in which.

DESCRIPTION OF THE PREFERRED EMBODIMENTS

Referring to the drawing figures, like reference numerals designate identical or corresponding elements throughout the several figures.

In order to attain the above-mentioned objective, according to a first aspect of the present invention, in order to pick and place a component, the present invention provides a plurality of heads movable along a closed path, means for stopping the above-mentioned head at a picking position and at a placing position, means for transmitting the kinetic energy of the head which is moving to the head which stops at the picking position or the placing position, and making them repel each other. By giving an initial velocity in the progress direction to at least one of the above-mentioned heads, the kinetic energy is sequentially transmitted to the following head, and the head having moved is made to stop at the position of the preceding head.

When an initial velocity is given to either one of the heads and is made to move in a predetermined direction along the closed path, this head having the kinetic energy approaches or comes into collision with the head which had stopped at the picking position or the placing position. The kinetic energy of the head which is moving is transmitted to the head which had stopped, and the head which had stopped starts moving. On the other hand, the head which is moving loses kinetic energy and stops at the picking position or the placing position, and a picking and placing operation is performed.

Because a component is conveyed by transmitting the kinetic energy of a head which is moving to a head which had been stopped, large amounts of energy are not consumed when starting the head, compared with the prior art. And energy can be reduced because only the velocity reduction of the head which moves along the closed path must be supported or maintained after giving initial velocity to the head. Because a large drive source for driving the head in this way is not needed, the apparatus can be reduced in size, and a complicated control system is not required. Furthermore, because the kinetic energy of the head which is moving is used when starting the head which had been stopped, the initial velocity at the time of moving of the head can be increased. While the peak velocity can be made high, the traveling time of the head can be shortened. Therefore, the conveying efficiency can be enhanced.

Moreover, according to a conveyor of the present invention, while either one of the heads is moving, another head stops at the picking position or the placing position, there is no time loss, and greater time can be spent on the picking operation and the placing operation. As a result, the reliability of the picking operation and the placing operation can be enhanced.

According to a second aspect of the present invention, as device repelling the head which is moving and the head which stops, it is desirable to use a magnet which has the same polarity in the opposing surfaces of the adjacent heads. In this case, because the head can be made to repel each other, preferably without colliding, by the resiliency of the magnet, both omission of the component from the chucked head and generation of noise of the component can be prevented.

According to a third aspect of the present invention, preferably a device for stopping the head at the picking position and the placing position includes a coil provided at the picking position and at the placing position, a magnetic-field generating device for generating a magnetic field orthogonal to the coil, the magnetic field generating device being provided with the head. As the magnetic field generating device or means, for example, a permanent magnet or an electromagnet can be used. Because stopping or thrust is forcibly applied to the head using an electromagnetic force, control becomes very simple, and the stopped object does not need to be made to contact the head.

It is desirable to provide means for detecting velocity of the moving head, and means for controlling the velocity of the moving head, according to a fourth aspect of the present invention. That is, if the speed of a moving head reduces, a head can be made to always move at a fixed velocity by making it speed up using a speed-control means. Therefore, the kinetic energy which is transmitted to the moving head becomes fixed and stable conveying can be performed.

According to a fifth aspect of the present invention, as a device or means for stopping the head at the picking position and at the placing position, the present invention preferably further provides a device or means for detecting that the moving head approaches within a fixed distance of the picking position or of the placing position of the stopped head, and a device or means for applying an offset thrust force in the progress direction to the stopped head at the picking position or at the placing position. If the moving head collides with the stopped head, the stopped position of the moving head is closer than the stopped position of the front head, at least more than the size of the head. When this accumulates, the stopped position of the head will gradually deviate from the picking position or the placing position. In order to prevent this problem, if the offset thrust force in the progress direction is given to the stopped head just before it collides, after the moving head motion collides with the head which stops, it is moved forward in the progress direction a little. The stopped position can be correctly made in accordance with the stopping position of the front head.

In addition, as a device or means for applying this offset thrust force, a combination of coils and magnetic-field generating means for generating the magnetic field orthogonal to the coils as in the third aspect of the present invention may be sufficient.

According to a sixth aspect of the present invention, when the head is attached at both ends of a horizontal rotatable lever, making the central portion thereof a fulcrum, the lever rotates like a propeller centering around the fulcrum, and the oscillation of the head or the rotation irregularity can be suppressed. A component conveyor having outstanding stability is therefore possible.

Moreover, according to a seventh aspect of the present invention, when a head is attached at one end part of the horizontal rotatable lever and the other end thereof is made as a fulcrum, a component conveyor having outstanding stability is possible by attaching a balancer at the opposite side of the lever interposing the fulcrum therebetween.

According to an eighth aspect of the present invention, a head is attached at one end part or the tip end of the horizontal rotatable lever, making the other end thereof a fulcrum, and the head can be rotatably centered on the fulcrum. In such a case of the component conveyor, as a means for stopping the head at the picking position and the placing position, a movable mass of the lever in the axial direction thereof and a spring which urges the mass toward the fulcrum are attached to the lever, and the inertial moment of the head during rotational movement may be made larger than the inertial moment of the stopped head. In other words, the mass is urged at the rotation-center side of the lever when the head stops, and the mass is made to move to the outer-diameter side by the centrifugal force when the head is rotated. Because the inertial moment during rotation is larger than the inertial moment during stopping, in the same manner as the case of the fourth aspect of the present invention, where the offset thrust force is applied, after the head which is moving collides with the head which was stopped, it is made to move in the progress direction a little. That stopping position of the head can be correctly made in accordance with the stopping position of the former head. Moreover, because the stopping of the head can be made automatic at the picking position and the placing position with mechanical means, control becomes simple.

FIGS. 1 to 4 illustrate a first example of a component conveyor according to the present invention.

Figure 1:
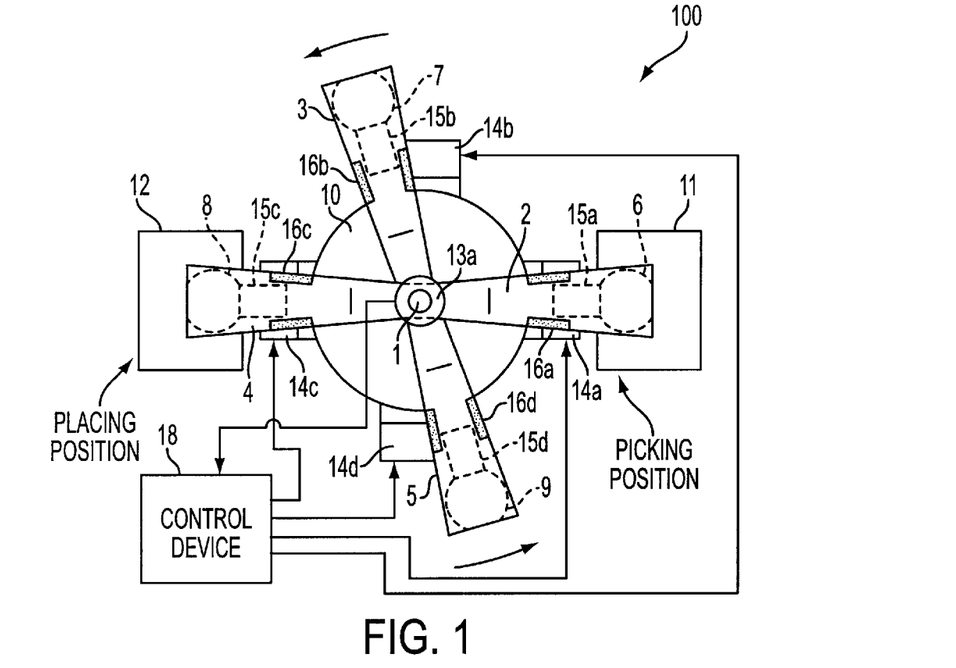
FIG. 1 illustrates a top plan view of an example of a component conveyor according to this invention.

A conveyor 100 includes four rotatable levers centering around a center spindle 1, and the levers 2 and 4 and the levers 3 and 5 are configured integrally such as a propeller, respectively. Heads 6 to 9 are respectively attached to the free-end part of levers 2 to 5. The heads 6 to 9 may be adsorption heads which perform vacuum suctioning of a component P, for example. Heads 6–9 may alternatively be chuck heads which mechanically chuck the component P. In addition, all the heads 6 to 9 preferably have a uniform inertial mass.

Figure 2:
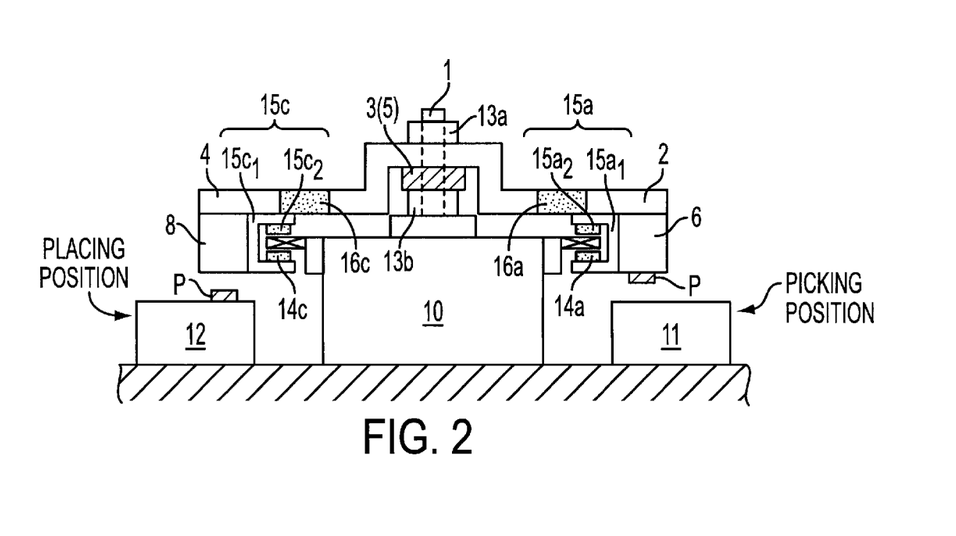
FIG. 2 illustrates a front elevational view of the component conveyor of FIG. 1.

The spindle 1 is installed on a base 10. A pick position or stage 11 for performing a picking operation and a placement position or stage 12 for performing a placement operation are arranged at two locations on a periphery (in this example 180 degrees symmetrical position) of base 10. The component P is transferred into the pick stage 11 from a component supply apparatus, such as a linear feeder or a pallet (not illustrated). On the other hand, a circuit board or the like (not illustrated) is mounted on the place stage 12. The component P, which is chucked by the heads 6 to 9, is mounted on this circuit board or the like. Because high accuracy is necessary for the placement operation, the place stage 12 may be a table movable in an X-Y direction or the (θ) direction with regard to the horizontal surface. In FIG. 1 and FIG. 2, heads 6 and 8 are stopped on each of the stages 11 and 12, respectively. On the other hand, heads 7 and 9 are rotating in the direction of arrow of FIG. 1, centering around spindle 1. Angle rotation detection sensors 13a and 13b, such as a rotary encoder, are provided at the central part of the above-mentioned levers 2 and 4, and the levers 3 and 5, respectively. The rotation positions of the levers 2 to 5 and the rotation position of each heads 6 to 9 can be detected by these sensors 13a and 13b. These sensors 13a and 13b can also serve as velocity sensors which detect the velocity of the heads 6 to 9.

Figure 3:
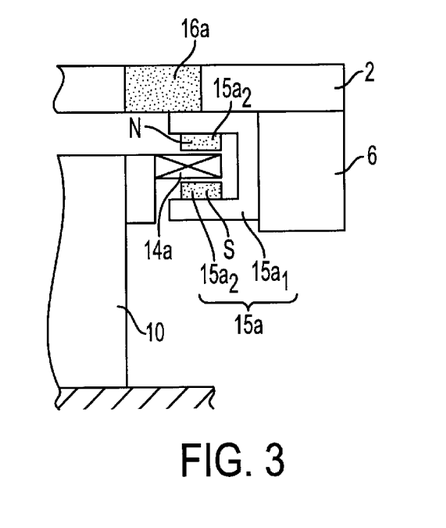
FIG. 3 illustrates an enlarged partial view of FIG. 2.
Figure 4:
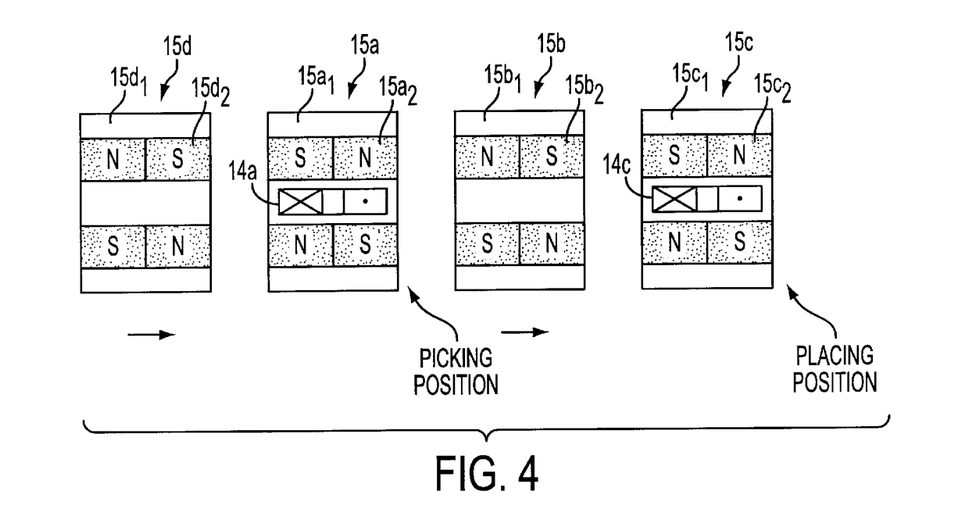
FIG. 4 diagrammically illustrates a relationship between the magnet for speed controls and a coil in accordance with the present invention.

Coils 14a to 14d are fixed to the periphery of the base 10 at four locations, being separated by 90 degrees, for example. The coils 14a to 14d are wound along the horizontal surface and coils 14a and 14c, which are at 180-degree symmetrical positions, correspond to the pick stage 11 and the place stage 12, respectively. Corresponding to these coils, magnetic-field generating devices or means 15a to 15d are attached to the lower part of the levers 2 to 5. Magnetic-field generating devices or means 15a to 15d include U-shaped yokes 15a1 to 15d1 and pairs of magnets 15a2 to 15d2 which are fixed to the inner-side surfaces of the yokes, as shown in FIG. 3. As for the relation between the magnets 15a2 to 15d2 and the coils 14a to 14d, as shown in FIG. 4, they are arranged so that the magnets 15a2 to 15d2 may generate a magnetic field orthogonal to the coils 14a to 14d. Therefore, when a current flows to the coils 14a to 14d in a direction shown in FIG. 4, for example, the force in the direction of an arrow in FIG. 4 is applied to the magnet 15a2 to 15d2. If the current direction is reversed, a force in the reverse direction of the arrow will be applied to the magnets 15a2 to 15d2. Thus, the magnets 15a2 to 15d2 and the coils 14a to 14d provide speed-control means which perform acceleration-deceleration control of the velocity of the levers 2 to 5 and the heads 6 to 9, and provide means for stopping the heads 6 to 9 at the picking position and the placing position.

On both sides in the rotation direction of the levers 2 to 5, repulsion magnets 16a to 16d are attached to the levers so that like poles face each other in the opposing surfaces of the adjacent levers 2 to 5. Therefore, when magnets 16a to 16d of adjacent levers approach within a fixed distance, a magnetic repulsive force will come into effect. In this example, the magnets 16a to 16d arc attached on both sides of all of the levers 2 to 5; however, since the levers 2 and 4 and the levers 3 and 5 are integrally constructed, it is possible to reduce the number of the magnets by half. In addition, the detecting signal of the sensors 13a and 13b is input into a control apparatus 18 and the coils 14a to 14d are controlled by the control apparatus 18.

The operation of a component conveyor which includes the above-mentioned configuration will now be described.

First, with the levers 2 and 4 in the picking position and the acing position, a predetermined initial velocity is given to the levers 3 and 5 in the reaction of the arrow and the levers 3 and 5 start rotating. This initial velocity may be given electro-magnetically, mechanically, or it may be applied by human power. Because the levers 3 and 5 (including heads 7 and 9), which are moving, have kinetic energy, if the lever 3 approaches the lever 4 and the lever 5 approaches to the lever 2, the stopped levers 2 and 4 receive the repulsion force of the magnets 16a to 16d, and begin to move. In other words, the kinetic energy of the heads 7 and 9 during motion is transmitted resiliently to the heads 6 and 8 during stopping. On the other hand, the heads 7 and 9 during motion lose kinetic energy, and stop at the picking position or placing position at which heads 6 and 8 were stopped. A picking operation or a placing operation can then be performed there. Henceforth, a similar operation is repeated.

Next, the principle for the above-mentioned magnetic repulsion effect is explained with reference to FIG. 5. In addition, the magnetic repulsion effect is transposed to a spring effect here, and is explained.

Figure 5A:
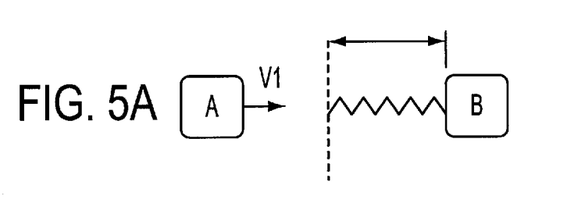
FIG. 5 is an explanatory drawing explaining the magnetic repulsing effect in FIG. 1.

When a moving head A of velocity V1 is separated by at least a natural length L of a spring of a head B which is stopped, as shown in FIG. 5(a), no thrust force is applied to the stopped head B.

Figure 5B:
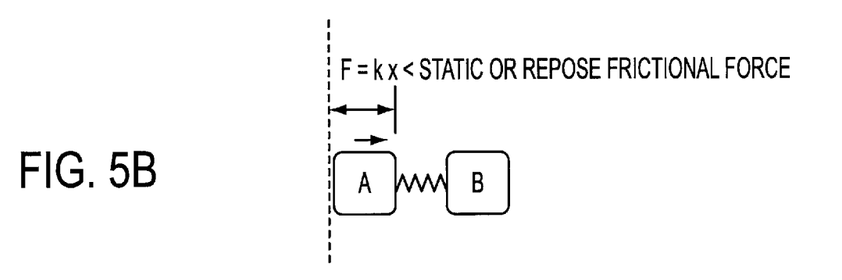

When the moving head A approaches within the natural length of the spring relative to the stopped head B, as shown in FIG. 5(b), the resiliency force F (=kx), which is proportional to the spring coefficient k and displacment x, is applied. However, because the static friction force of the head B is larger than the resiliency force F, the head B does not yet move.

Figure 5C:
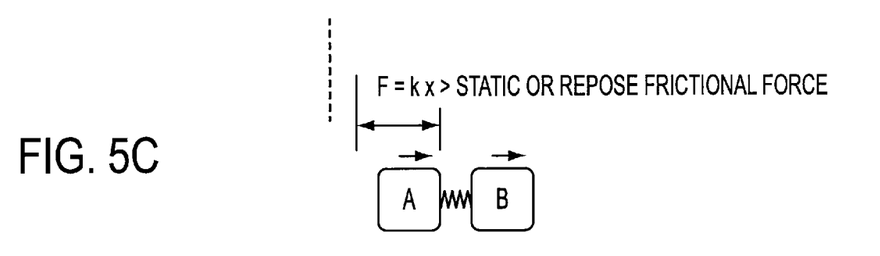

When the head A moves further toward the head B further, as shown in FIG. 5(c), because the resiliency force F becomes larger than the static friction force, the head B starts moving.

Figure 5D:
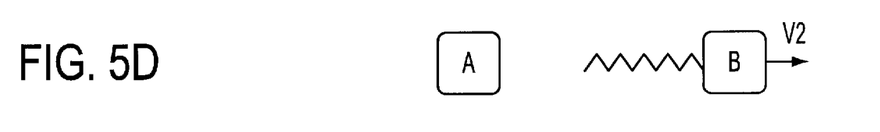

Soon, as shown in FIG. 5(d), while the head A stops near the position where the head B was stopped at the beginning (see FIG. 5(a)), the head B moves in the direction separated from head A at the velocity V2.

Thus, the head B which had been stopped can be made to move at the predetermnined velocity V2 by transmitting the kinetic energy of the head A during motion to the head B. Because exceptional force from the outside is not required to be added at this time, even if the inertial mass of the head B is large, the head B can be made to move with low energy consumption. Moreover, by using magnetic resiliency, because the collision of the head A and the head B does not need to be made directly, the impact load given to the heads A and B is made to be about zero. Because the component is chucked to the head A or the head B, it is essential to make the conveying operation stable by making the impact force as low as possible. However, the omission of a component and generating of noise can be prevented by making the impact force as small as mentioned above.

Figure 6:
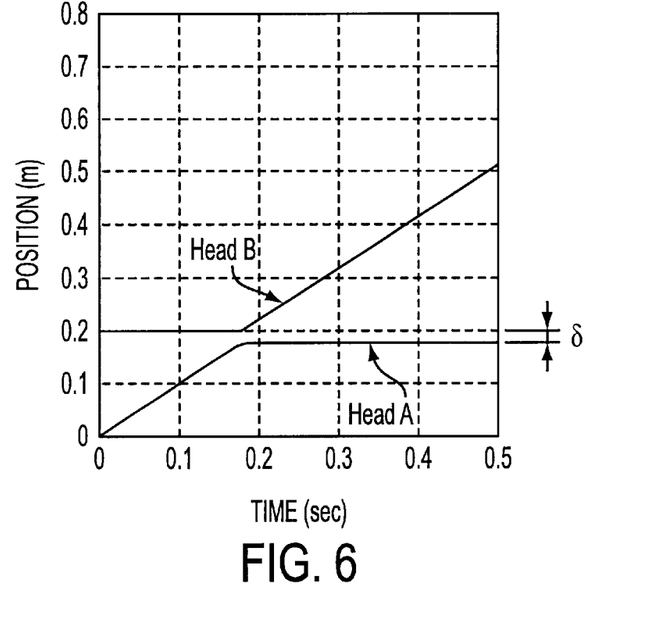
FIG. 6 illustrates a time variation diagram of the variation of each head in the cage of not applying offset thrust.

FIG. 6 shows the displacement of the head A and the head B under the operation of the ideal magnetic repulsion as shown in FIG. 5. As clearly shown from the diagram, the stopping position of the head A is closer by at least more than the size of the head from the stopping position of the head B. In other words, a gap (δ) is produced in the stopping position. When this gap (δ) accumulates, the stopping position of the head will gradually deviate from the picking position or the placing position. In order to prevent this, an offset thrust is applied in the progress direction to the head B which stops just before it repels. Specifically, the sensors 13a and 13b detect the position of the moving head A; based on that positional information, the applied current to the coils 14a and 14c corresponding to the pick stage 11 and place stage 12 is controlled, thereby providing an offset thrust (initial velocity) to the stopped head B.

Figure 7:
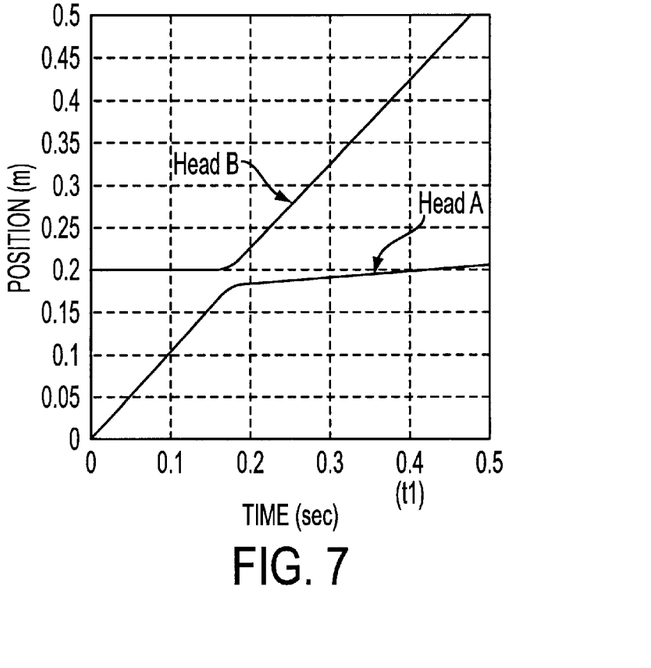
FIG. 7 illustrates a time variation diagram of the variation of each head at the time of applying offset thrust.

FIG. 7 shows the displacement of the head A and the head B when giving the aforementioned offset thrust. As clearly shown from the diagram, the head A has a velocity a little after magnetic-repulsion, and it continues moving. It is then sufficient just to stop the head A by some method, when the head A reaches its inherent stopping position (time t1). Further, the above-mentioned magnetic-field generating means 15a to 15d and the coils 14a to 14d may be utilized for the stopping control in this case. Or, other methods (for example, a method of pushing a friction pad to the head A in order to stop the head A, or the like) may be used.

Figure 8:
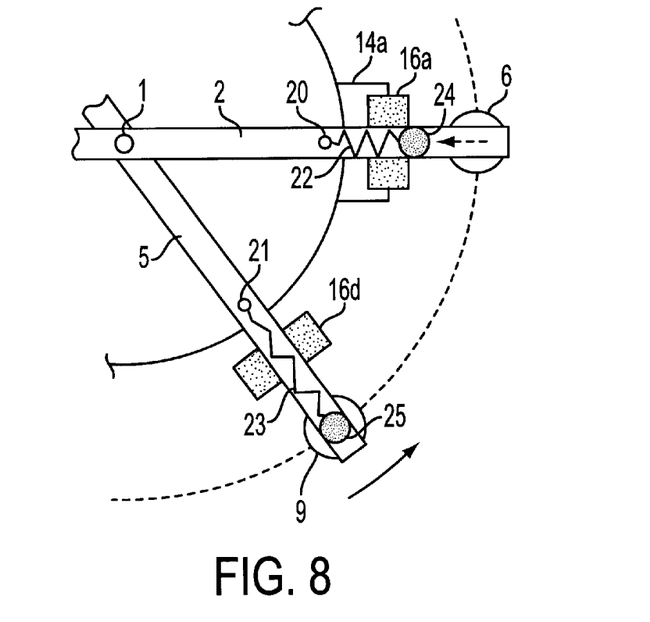
FIG. 8 illustrates a partial top plan view of a second example of the present invention.

FIG. 8 illustrates a second example of the present invention. In the figure, the same reference numerals are given to the same components as in FIG. 1, and an explanation thereof is therefore omitted.

In this example, the same function as the above-mentioned offset thrust is achieved using the inertial moment of the head. That is, tensile springs 22 and 23, one end of each being respectively fixed by pins 20 and 21, are attached to the levers 2 and 5. Inertial weights 24 and 25, movable in the axial direction of the levers 2 and 5, are attached at tip ends of the springs 22 and 23. In the lever 5 during motion, the inertial weight 25 moves to a free-end side of the lever 5 by centrifugal force, and the spring 23 is extended. On the other hand, as for lever 2 which stops, because the centrifugal force is not applied to the inertial weight 24, it is in a position which is near to the rotation-center 1 side by the spring 22. Therefore, the inertial moment of the lever 5 during motion is larger than the inertial moment of the stopped lever 2.

In the case of the above, when the moving lever 5 approaches the stopped lever 2 within a fixed distance, the lever 2 starts moving by the magnets 16a and 16d by their repulsion effect. However, because the inertial moment of the lever 5 is larger than the inertial moment of the lever 2, the lever 5 also has some velocity despite magnetic repulsion, and it continues moving. Therefore, this lever 5 should securely be stopped at the inherent stopping position by stopping with a certain means. In order to perform the speed control and the stopping control of the heads 6 to 9, by providing the coils 14a to 14d as in the first example, the magnetic-field generating device or means (not illustrated) may be provided on the levers 2 to 5.

Figure 9:
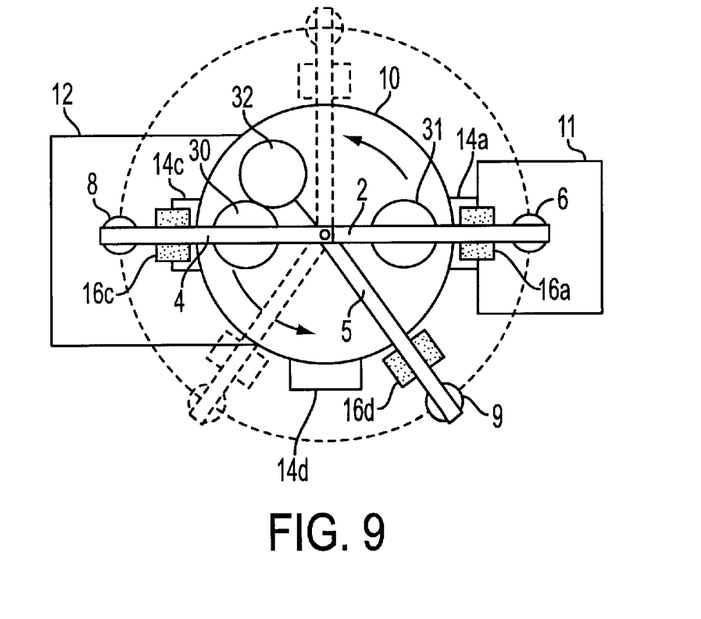
FIG. 9 illustrates a top plan view of a third example of the present invention.

FIG. 9 illustrates a third example of the present invention.

In this example, one-end part of the three levers 2, 4, and 5 is supported rotatably around the spindle 1. The heads 6, 8, and 9 are respectively attached to the other-end part. Balancers 30 to 32 are attached to the other ends thereof at the opposite side of the head 6, 8, and 9, interposing the spindle 1 therebetween. As for each balancers 30–32, it is desirable to have almost the same mass as the sum of the mass of the heads 6, 8, and 9 and the levers 2, 4, and 5. In this case, while absorbing the rotation fluctuation of the levers 2, 4, and 5 by the balances 30–32, the oscillation of the heads 6, 8, and 9 is suppressed, and the above-mentioned advantage is possible. In addition, although not illustrated in FIG. 9, a device or means for generating the magnetic field both for speed control and stopping control is provided on each levers 2, 4, and 5.

Figure 10:
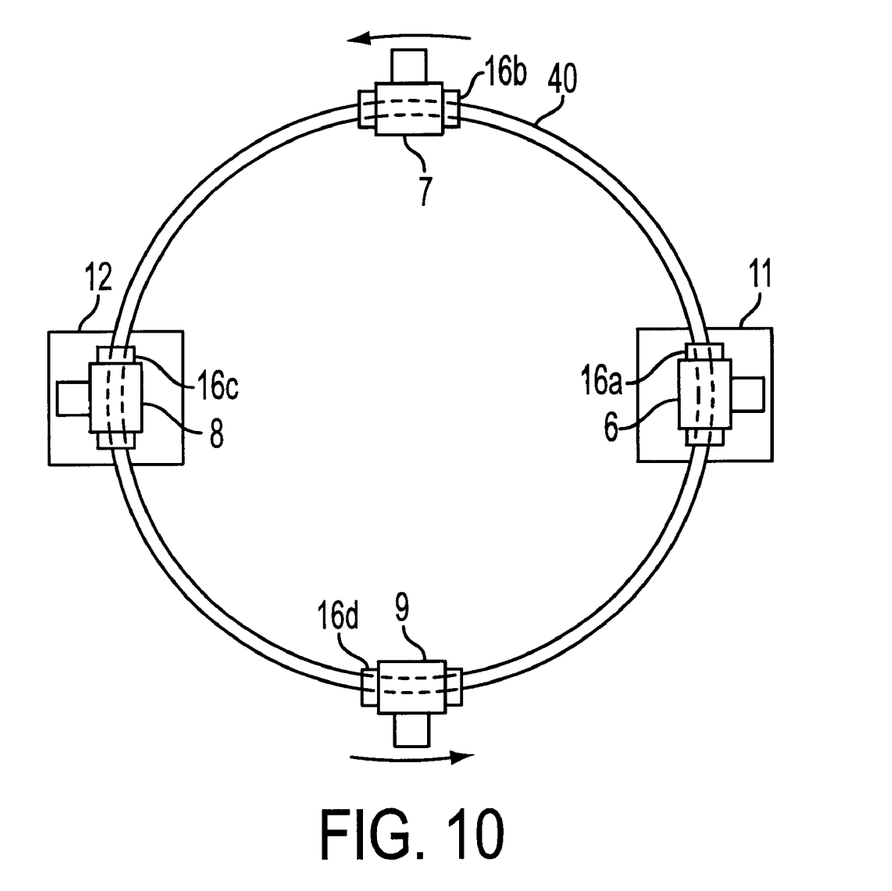
FIG. 10 illustrates a top plan view of a fourth example of the present invention.

FIG. 10 illustrates a fourth example of the present invention.

In this example, a plurality of heads 6 to 9, which are on a lap rail 40 laid on a horizontal surface, are arranged to be individually movable. The shape of the rail 40 can be arbitrarily changed to an ellipse type, a track shape, and the like, in addition to being circular, as long as the head can run along the closed path freely. In this case, because the lever which rotates around the spindle as a center is not required, it is possible to secure the space for arranging various components in the rail 40.

In addition, references 16a to 16d are the magnets for repulsion in the figure. Moreover, in order to perform the speed control and the stopping control of the heads 6 to 9, magnetic-field generating devices or means are provided in the heads 6 to 9. For example, a coil may be arranged near the rail 40.

In the above-mentioned first to third examples, in order to correctly stop the head or the lever during motion at the inherent stopping position, an offset thrust is applied. Moreover, the moment of inertia was changed. However, it is not restricted to this. For example, electromagnetic force or machine power can be used to adjust the stopping position of the head or the lever which stops to the inherent stopping position.

The number of heads (levers) is made into four pieces in FIG. 1, and it is made three pieces in FIG. 9. However, the present invention is not restricted to this, and it is sufficient to have three or more pieces. Moreover, in the above-mentioned example, magnetism was used as a repulsion effect. However, an elastic collision of the head may be directly used, or the repulsion effect of a spring may be used. When using the repulsion effect of a spring, elastic bodies, such as a spring and rubber, are attached to the opposite position of the adjacent levers or heads, and the resiliency of the spring is applied when the adjacent levers or heads approach within a fixed distance. In this case, the load by contact between a spring and a lever or the head is generated; however, the shock is low because that load variation is not strict.

This present invention provides the following effects by the above explanation.

(1) With the present invention, because the kinetic energy of the head during motion is transmitted to the stopped head, and since the head moves and stops intermittently, it does not consume much energy. The number of parts of the apparatus is low and they become small-sized, and the control system also becomes simple. Therefore, a cost reduction can be achieved.

(2) Because the repulsion effect between the head during motion and the stopped head is used, initial velocity of the head can be increased, and the traveling time of the head can be shortened. Therefore, sufficient time for a picking operation and a placing operation can be spent, and reliable picking and placing operation can be achieved.

What is claimed is:

1. A component conveyor, comprising:
   a plurality of heads movable along a closed path for picking a placing operations of a component;
   means for stopping the plurality of heads at a picking position and a placing position; and
   means for transmitting the kinetic energy of a moving one of the plurality of heads to a stopped one of the plurality of heads at the picking position or the placing position, and for causing them to be mutually repelled;
   wherein, by applying an initial velocity in a progress direction along said closed path to at least one of the plurality of heads, the kinetic energy of said at least one head is transmitted to another one of the plurality of heads, and the at least one head is thereby made to stop at the position of the stopped head.

2. A component conveyor in accordance with claim 1, wherein the means for causing the heads to be mutually repelled is provided on opposing surfaces of adjacent heads, and includes magnets which have the same polarity facing each other.

3. A component conveyor in accordance with claim 1, wherein the means for stopping the plurality of heads includes:
   a coil provided at the picking position and at the placing position;
   a magnetic field generating means for generating a magnetic field orthogonal to the coil, said magnetic field generating means being provided on the plurality of heads.

4. A component conveyor in accordance with claim 1, further comprising means for detecting the velocity of a moving head of the plurality of heads, and means for controlling the velocity of the moving head.

5. A component conveyor in accordance with claims 1, wherein said means for stopping includes:
   means for detecting that a moving head approaches within a fixed distance of a stopped head at the picking position or the placing position; and
   means for providing on offset thrust in the progress direction to the stopped head when the detecting means detects said approach.

6. A component conveyor in accordance with claim 1, further comprising a horizontally rotatable lever including a fulcrum portion and two ends, and wherein the plurality of heads are attached to both ends of said lever.

7. A component conveyor in accordance with claim 1, further comprising a plurality of horizontally rotatable levers each including a fulcrum portion and two ends, wherein the plurality of heads are each attached to one end of each of said plurality of levers, the other end of each of said plurality of levers acting as a fulcrum, each head being rotatable about a fulcrum, and further comprising a balancer attached at a portion of each of said plurality of levers at a side opposite from each head.

8. A component conveyor in accordance with claim 1, further comprising a plurality of horizontally rotatable levers each including a fulcrum portion and two ends, wherein the plurality of heads are each attached at one end of each of the plurality of said levers, one of an opposite end of each lever or the center portion of each lever including the fulcrum, each head being rotatabe about a fulcrum,
   wherein the means for stopping includes a mass attached to each of the plurality of said levers, each said mass being movable along the axial direction of the lever, and including a spring for urging each mass toward the fulcrum,
   and wherein the inertial moment of each moving head is larger than the inertial moment of a stopped head.

* * * * *